(12) United States Patent
Jaussi et al.

(10) Patent No.: US 6,686,863 B1
(45) Date of Patent: Feb. 3, 2004

(54) A/D SIGNAL CONVERSION BASED ON A COMPARISON OF VOLTAGE-DIVIDED SIGNALS

(75) Inventors: James E. Jaussi, Hillsboro, OR (US); Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/261,521

(22) Filed: Sep. 30, 2002

(51) Int. Cl.$^7$ ................................................. H03M 1/34
(52) U.S. Cl. ........................ 341/158; 341/155; 341/159
(58) Field of Search ................................. 341/165, 155, 341/159, 158, 122

(56) References Cited

U.S. PATENT DOCUMENTS

| | | | | |
|---|---|---|---|---|
| 5,351,010 A | * | 9/1994 | Leopold et al. | 324/704 |
| 5,731,776 A | * | 3/1998 | Kumamoto et al. | 341/159 |
| 6,252,471 B1 | * | 6/2001 | Salter et al. | 331/179 |
| 6,388,594 B1 | * | 5/2002 | Velazquez et al. | 341/120 |
| 6,437,724 B1 | * | 8/2002 | Nagaraj | 341/159 |
| 6,452,529 B1 | * | 9/2002 | Li | 341/156 |
| 6,459,400 B1 | * | 10/2002 | Steinbach | 341/156 |
| 6,473,013 B1 | * | 10/2002 | Velazquez et al. | 341/120 |

\* cited by examiner

*Primary Examiner*—Peguy Jeanpierre
(74) *Attorney, Agent, or Firm*—Buckley, Maschoff & Talwalkar LLC

(57) ABSTRACT

According to some embodiments, a circuit includes two voltage dividers, each adapted to receive different ones of two signals, the two signals together representing a data signal, and a comparator to compare a voltage generated by a first of the two voltage dividers with a voltage generated by a second of the two voltage dividers.

17 Claims, 8 Drawing Sheets

A/D SIGNAL CONVERSION BASED ON A COMPARISON OF VOLTAGE-DIVIDED SIGNALS

BACKGROUND

Small electronic circuits are often used in conjunction with high frequency signals. However, some transmission materials used in such circuits exhibit lossy transmission characteristics with respect to high frequency signals. For example, signals transmitted at 3 to 4 GHz over a small portion of FR4 substrate may experience 30 to 40 dB of loss.

Circuit designers may use analog or digital filters to compensate for the loss. Digital filters usually provide a better combination of linearity, power consumption and scalability than analog filters. However, before a digital filter can filter an analog signal, the signal must be converted to a digital signal by an analog-to-digital converter.

Signals may be transmitted using many signaling schemes. One known scheme is differential current-mode signaling, in which data is represented by a difference between two currents carried by (usually) adjacent signal lines. Differential current-mode signaling is known to result in better common mode noise rejection, power-supply noise rejection, and less return current than other signaling systems. Signaling may be further improved by terminating each signal line with an impedance equal to the intrinsic line impedance. Such impedance matching reduces reflections and crosstalk within the signal lines. Unfortunately, additional elements required for the termination impedance require additional power.

DETAILED DESCRIPTION

Figure 1:
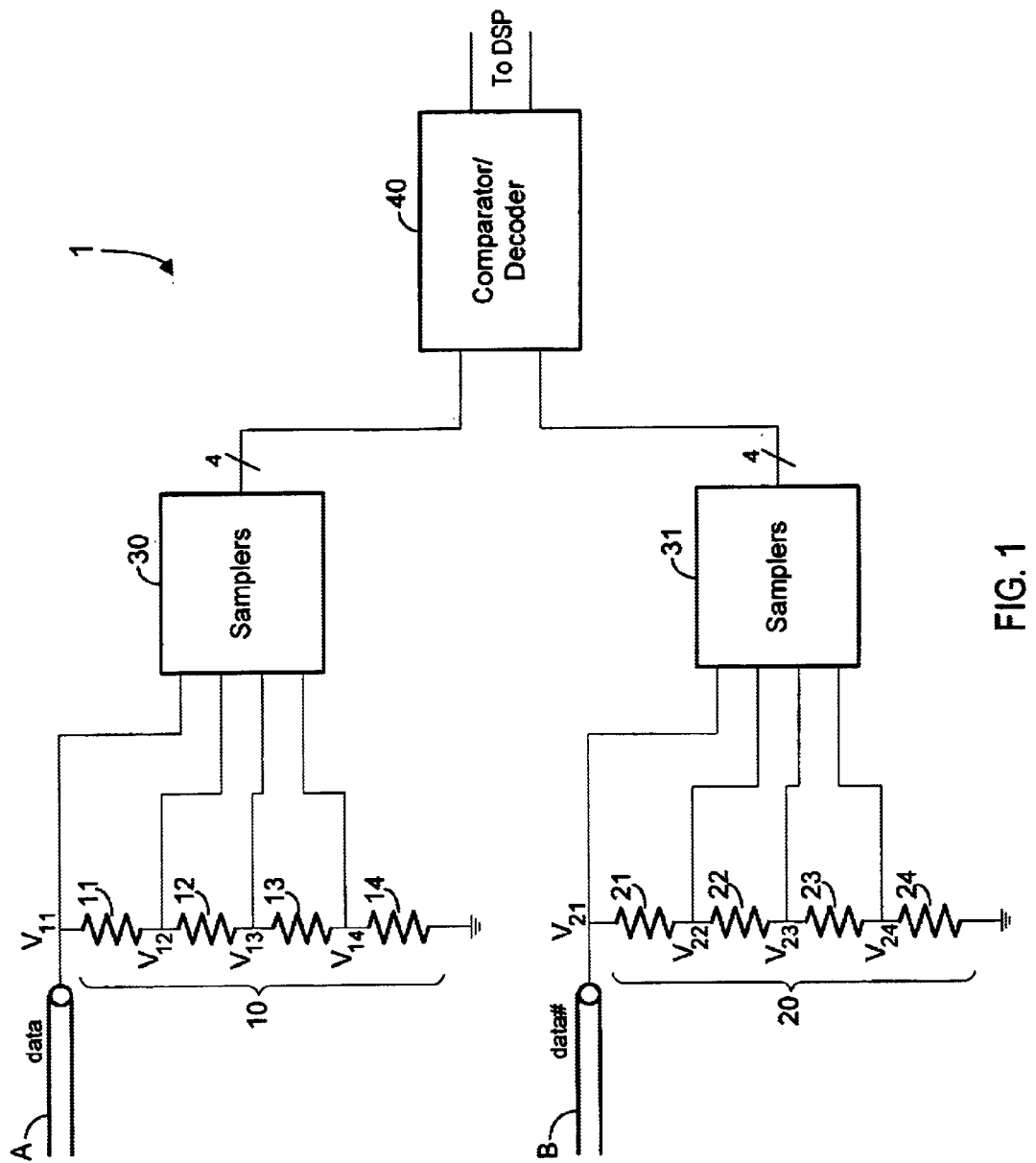
FIG. 1 is a block diagram of portions of a flash analog-to-digital converter according to some embodiments.

FIG. 1 is a block diagram of portions of flash analog-to-digital (A/D) converter 1 according to some embodiments. A/D converter 1 includes resistor string 10, which in turn is composed of resistors 11 through 14. As shown, resistor string 10 is couplable to signal line A. A/D converter 1 also includes resistor string 20, which is composed of resistors 21 through 24. Resistor string 20 is couplable to signal line B.

Signal lines A and B may together transmit data according to a differential current-mode signaling protocol. As briefly described above, data is represented in differential current-mode signaling by a difference between two currents carried on two signal lines. The signals carried by differential signal lines A and B will be referred to herein as data and data#, respectively. In some embodiments, data and data# are current signals driven by a transmitting device to A/D converter 1.

Each of resistor strings 10 and 20 functions as a voltage divider according to some embodiments. In operation, resistor string 10 generates a voltage across resistors 11 through 14 according to the equation $V_{11}=I_{data}(R_{11}+R_{12}+R_{13}+R_{14})$, where $I_{data}$ is a value of current signal data. Various voltages less than $V_{11}$ appear at nodes located between resistors 11 and 12, between resistors 12 and 13, and between resistors 13 and 14. Values of these voltages are determined based on the relative resistances of resistors 11 through 14. For example, in a case that each of resistors 11 through 14 has a same resistance, voltage $V_{12}$ generated by resistor string 10 would be equal to $\frac{3}{4}V_{11}$, voltage $V_{13}$ generated by resistor string 10 would be equal to $\frac{1}{2}V_{11}$, and voltage $V_{14}$ generated by resistor string 10 would be equal to $\frac{1}{4}V_{11}$. Similar explanations apply with respect to resistors 21 through 24 of resistor string 20.

In some embodiments, a total impedance $(R_{11}+R_{12}+R_{13}+R_{14})$ of resistor string 10 is equal to an impedance of signal line A. By matching these impedances, reflections in signal line A may be reduced. Since, as will be described below, resistor string 10 also performs a voltage-dividing function used for A/D conversion, the embodiment of FIG. 1 may require less power than other configurations in which separate elements are used for A/D conversion and for signal line termination. Of course, a total impedance of resistor string 20 may also or alternatively be set equal to an impedance of signal line B.

Samplers 30 generate sampled voltages representing a differential-mode signal. In the present example, samplers 30 sample voltages $V_{11}$, $V_{12}$, $V_{13}$, and $V_{14}$. Since current signal data is an analog signal, voltages $V_{11}$, $V_{12}$, $V_{13}$, and $V_{14}$ will vary according to variations in current signal data. Accordingly, samplers 30 attempt to capture voltages $V_{11}$, $V_{12}$, $V_{13}$, and $V_{14}$ at an appropriate point in their variation, such as a peak, a point reflecting a root-mean-square of the varying voltage, and/or another point.

Figure 2:
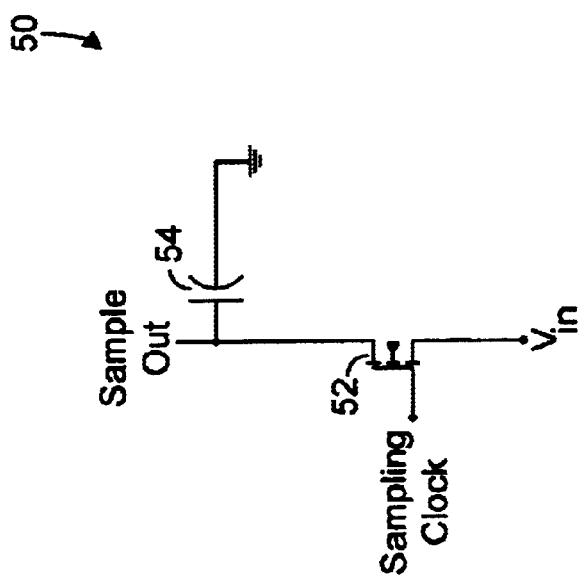
FIG. 2 is an example of a sampler circuit according to some embodiments.

FIG. 2 illustrates sampler 50 according to some embodiments. In one example of the FIG. 1 embodiment, samplers 30 comprise four instances of sampler 50, with each instance adapted to sample a different one of voltages $V_{11}$, $V_{12}$, $V_{13}$, and $V_{14}$. Sampler 50 comprises n-channel metal oxide semiconductor (NMOS) transistor 52 and capacitor 54. A source of transistor 52 is coupled to $V_{in}$, wherein $V_{in}$ is one of $V_{11}$, $V_{12}$, $V_{13}$, and $V_{14}$. A gate of transistor 52 is coupled to a sampling clock that determines which points of $V_{in}$ are sampled, and a drain of transistor 52 is coupled to capacitor 54, which in turn is coupled to ground.

In operation, capacitor 54 is charged to $V_{in}$ when the sampling clock is high. Accordingly, $V_{in}$ can thereafter be read out from a node between the drain of transistor 52 and capacitor 54. Samplers 31 comprise four instances of sampler 50 according to some embodiments, and therefore are used to capture voltages $V_{21}$, $V_{22}$, $V_{23}$, and $V_{24}$.

Returning to FIG. 1, samplers 30 and 31 are coupled to comparator/decoder 40. The voltages captured by samplers 30 and 31 may be transmitted to comparator/decoder 40. Generally, comparator/decoder 40 may be adapted to compare a voltage generated by resistor string 10 with a voltage generated by resistor string 20. Comparator/decoder 40 may also be adapted to generate a code representing a differential-mode signal represented by current signals data and data#. In the FIG. 1 example, the code may be a two-bit code representing data of the differential-mode signal, which may be passed on to a Digital Signal Processor (DSP) for further processing such as filtering.

Figure 3:
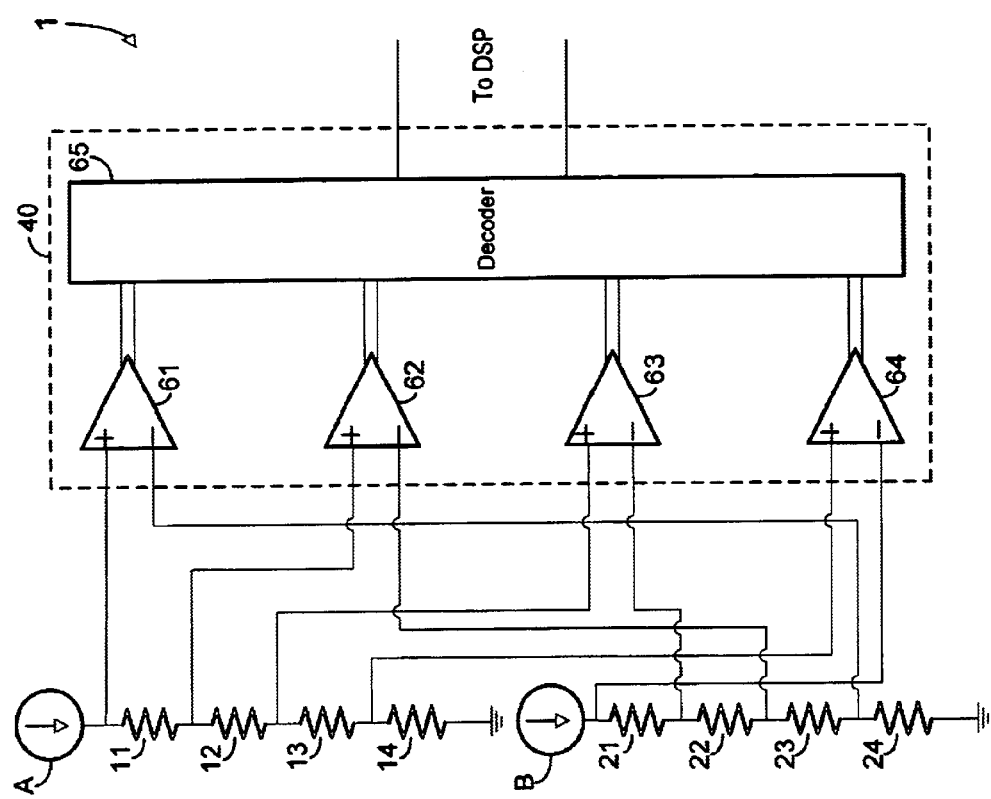
FIG. 3 is a block diagram of portions of a flash analog-to-digital converter according to some embodiments.

FIG. 3 illustrates some elements of A/D converter 1 according to some embodiments. Signal lines A and B are depicted as current sources, samplers 30 and 31 have been removed for clarity, and several internal components of comparator/decoder 40 are illustrated. Specifically, comparator/decoder 40 of FIG. 3 includes comparators 61 through 64 and decoder 65.

Comparator 61 comprises a comparison circuit adapted to compare a highest voltage ($V_{11}$) generated by resistor string 10 with a lowest voltage generated by resistor string 20 ($V_{21}$). Comparators 62 through 64 similarly compare voltages generated by resistor string 10 with voltages generated by resistor string 20.

In the illustrated embodiment, results of the comparisons are transmitted to decoder 65 from each comparator using two signal lines operating in differential mode. Use of differential-mode signaling may allow use of comparators that require lower power than would be otherwise required. The comparator results may be transmitted to decoder 65 in single-ended fashion. Decoder 65 is adapted to generate a code representing a differential-mode signal comprised by current signals data and data# based on one or more of the comparisons.

For purposes of describing some embodiments of A/D converter 1 of FIG. 3, it is assumed that 800 mV are used for differential-mode signaling, an impedance of signal lines A and B is equal to 50 ohms, and each of resistors 11 through 14 and 21 through 24 has a resistance of 12.5 ohms. A/D converter 1 generates a two-bit binary code corresponding to one of four data levels represented by current signals data and data# of lines A and B. According to the present example, the four data levels may be represented by the pairs of voltages ($V_{11}$, $V_{21}$) generated by current signals data and data# in conjunction with resistor strings 10 and 20.

The following table illustrates, for each data level, a corresponding two-bit code and a representative voltage pair ($V_{11}$, $V_{21}$). The table also includes values output from comparators 61 through 64 in response to each voltage pair. In this regard, voltages $V_{12}$, $V_{13}$, and $V_{14}$ are respectively equal to $¾V_{11}$, $½V_{11}$, and $¼V_{11}$, and voltages $V_{22}$, $V_{23}$, and $V_{24}$ are respectively equal to $¾V_{21}$, $½V_{21}$, and $¼V_{21}$.

| Data level | Code | ($V_{11}$, $V_{21}$) | (61, 62, 63, 64) |
|---|---|---|---|
| 1 | 00 | (100, 700) | (0, 0, 0, 0) |
| 2 | 01 | (300, 500) | (1, 1, 1, 0) |
| 3 | 10 | (500, 300) | (1, 0, 0, 0) |
| 4 | 11 | (700, 100) | (1, 1, 1, 1) |

Accordingly, decoder 65 may comprise a decoding circuit for generating each two-bit code in the above table based on the comparator outputs associated with the code. This circuit may comprise software, firmware and/or hardware-based logic and may be determined using Karnaugh maps of the above inputs and outputs or using any currently- or hereafter-known system.

Figure 4:
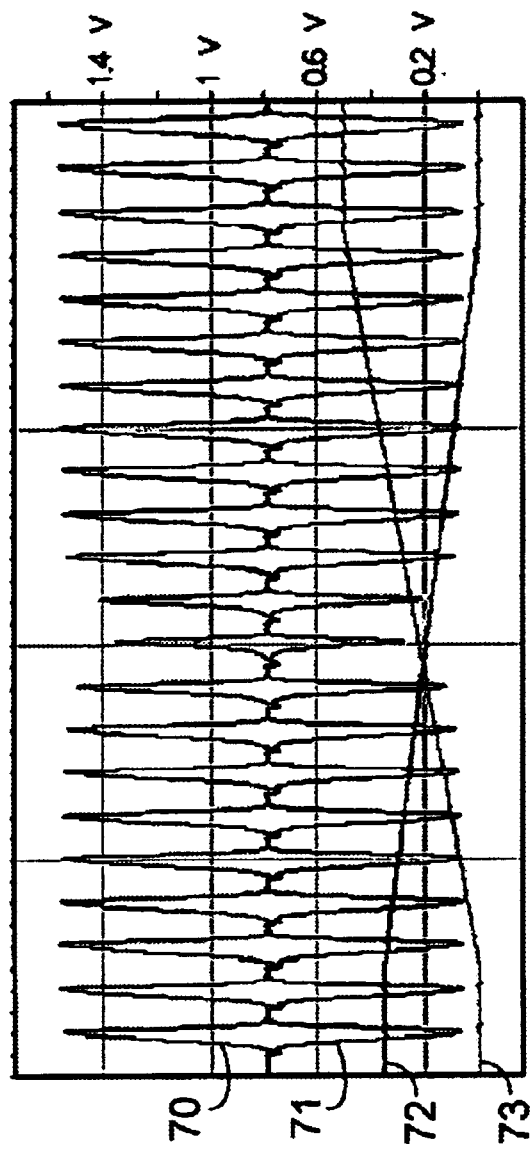
FIG. 4 illustrates relationships between a divided voltage signal associated with a data signal, a divided voltage signal associated with a data# signal, and differential outputs of a comparator coupled to the voltage signals according to some embodiments.

FIG. 4 illustrates differential outputs of a comparator according to some embodiments. The comparator of FIG. 4 is an element of a four-bit A/D converter. The A/D converter is configured similarly to A/D converter 1, but each resistor string of the four-bit converter includes sixteen resistors (not shown). The comparator compares a voltage $V_{19}$ at a node located between an eighth and ninth (counting from the top) resistor of a resistor string coupled to signal line A with a voltage $V_{28}$ at a node located between a seventh and eighth resistor of a resistor string coupled to signal line B. Waveforms 70 and 71 of FIG. 4 are the differential outputs of the comparator and waveforms 72 and 73 respectively represent voltages $V_{19}$ and $V_{28}$ as voltage $V_{11}$ is swept from zero to 800 mV and as voltage $V_{21}$ is swept from 800 mV to zero. The comparator outputs may be used as described above to generate a code representing a differential-mode signal based on a comparison of voltages $V_{19}$ and $V_{28}$.

Figure 5:
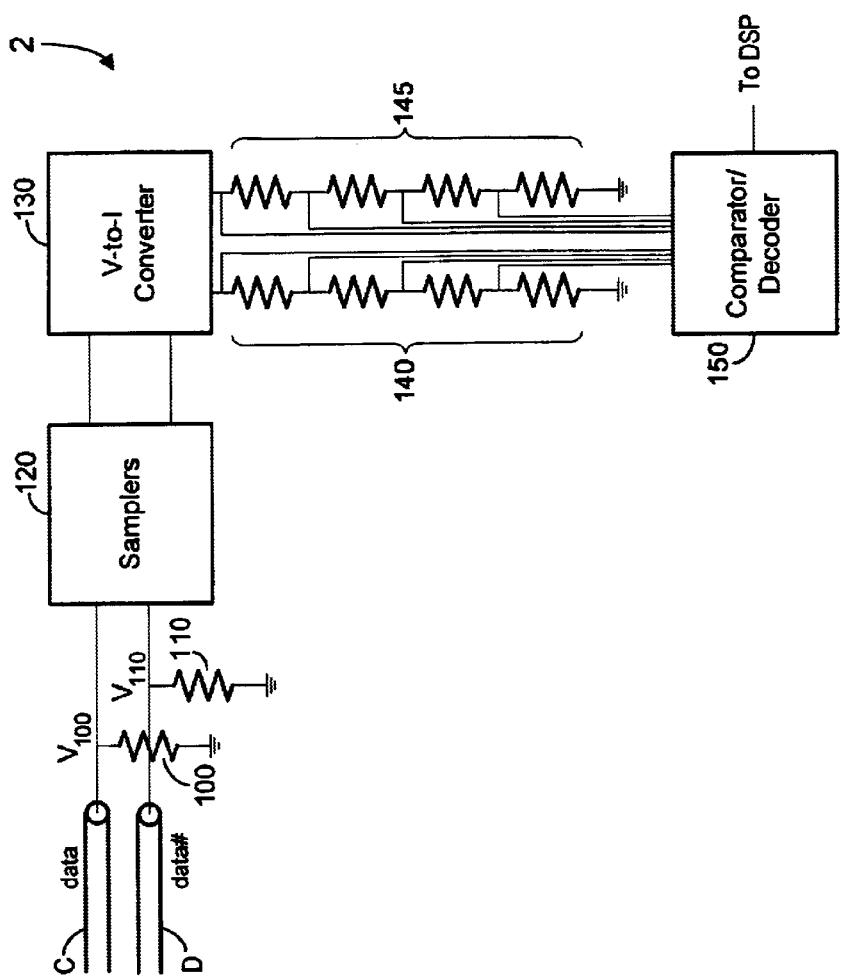
FIG. 5 is a block diagram of portions of a flash analog-to-digital converter according to some embodiments.

FIG. 5 is a block diagram of portions of A/D converter 2 according to some embodiments. A/D converter 2 includes signal lines C and D adapted to carry a differential-mode signal via current signals data and data#. Signal lines C and D are respectively coupled to termination resistors 100 and 110. In some embodiments, an impedance of each of resistors 100 and 110 matches an impedance of the signal line to which it is coupled.

Voltages $V_{100}$ and $V_{110}$ are generated by resistors 100 and 110 and current signals data and data#, and therefore represent the differential mode signal carried by signal lines C and D. Samplers 120 are adapted to sample voltages $V_{100}$ and $V_{110}$. Some embodiments of samplers 120 include two samplers such as sampler 50 of FIG. 2. As described with respect to FIG. 2, samplers 120 attempt to capture voltages $V_{100}$ and $V_{110}$ at an appropriate point in their variation, such as a peak, a point reflecting a root-mean-square voltage, and/or another point.

Voltage-to-current converter 130 receives the sampled voltages, converts the voltages to currents, and provides the currents to resistor strings 140 and 145. As described with respect to resistor strings 10 and 20, resistor strings 140 and 145 perform a voltage-dividing function. Accordingly, other types of voltage dividers may be substituted for resistor strings 140 and 145 in some embodiments. Comparator/decoder 150 of A/D converter 2 operates similarly to comparator/decoder 40 of A/D converter 1, therefore a detailed description thereof is omitted for the sake of brevity.

Figure 6:
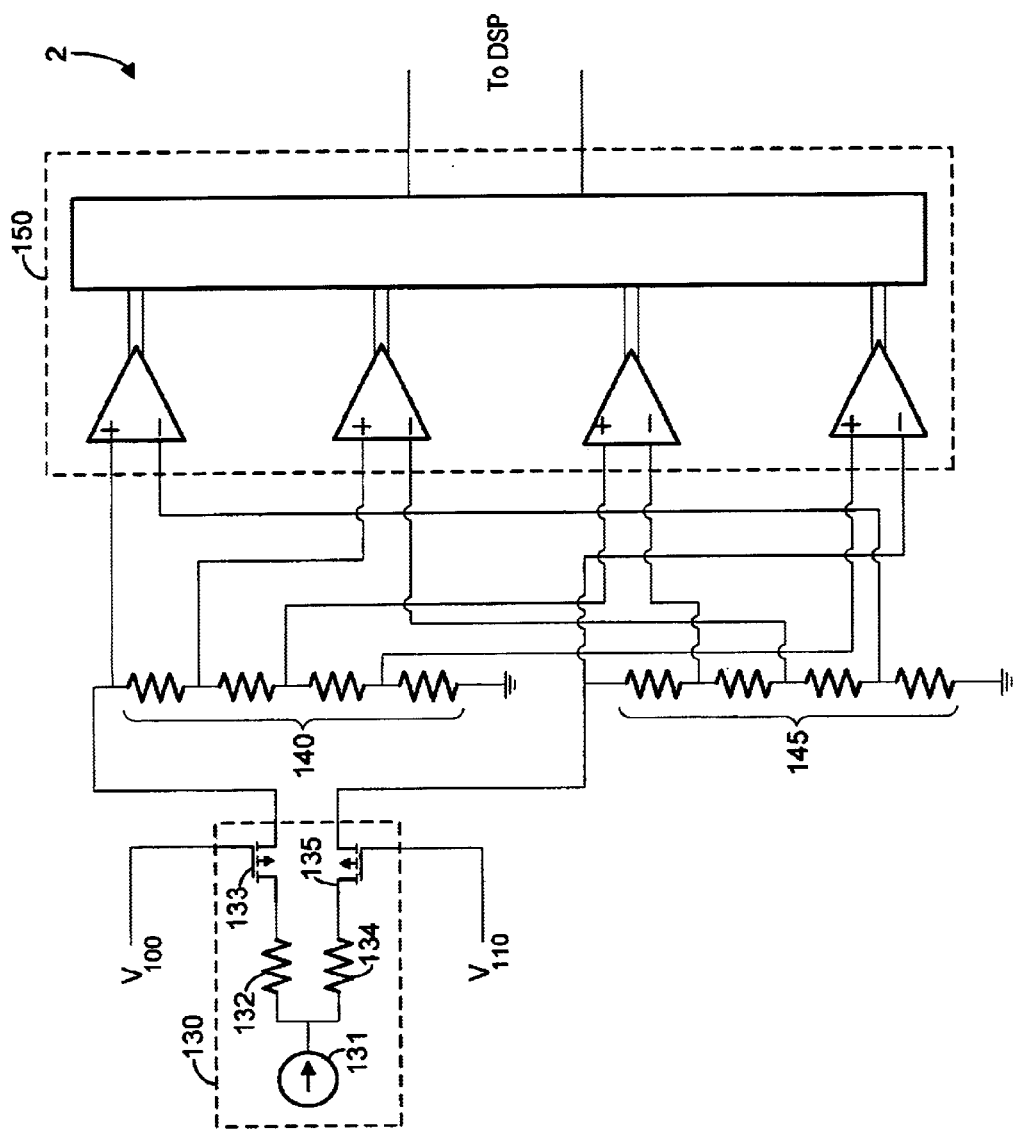
FIG. 6 is a block diagram of portions of a flash analog-to-digital converter according to some embodiments.

FIG. 6 is a block diagram of A/D converter 2 for use in describing voltage-to-current converter 130 in further detail. As shown, converter 130 includes bias current source 131 coupled to resistor 132, which in turn is coupled to a source of PMOS transistor 133. A gate of transistor 133 is coupled to sampler 120 so as to receive voltage $V_{100}$, and a drain of transistor 133 is coupled to resistor string 140. Resistor 134 and PMOS transistor 135 are similarly coupled to one another and to bias current source 131, resistor string 145, and sampler 120 so as to receive voltage $V_{110}$.

Voltage-to-current converter 130 is adapted to convert voltage $V_{100}$ to a current to be provided to resistor string 145, and also to convert voltage $V_{110}$ to a current to be provided to resistor string 140. Voltage-to-current converter 130 may operate to reject power supply noise present in the signals received from samplers 120. Resistor strings 140 and 145 generate voltages in conjunction with the currents provided by converter 130. Since the generated voltages represent current signals data and data#, the voltages may be processed by comparator/decoder 150 as described above with respect to comparator/decoder 40.

Figure 7:
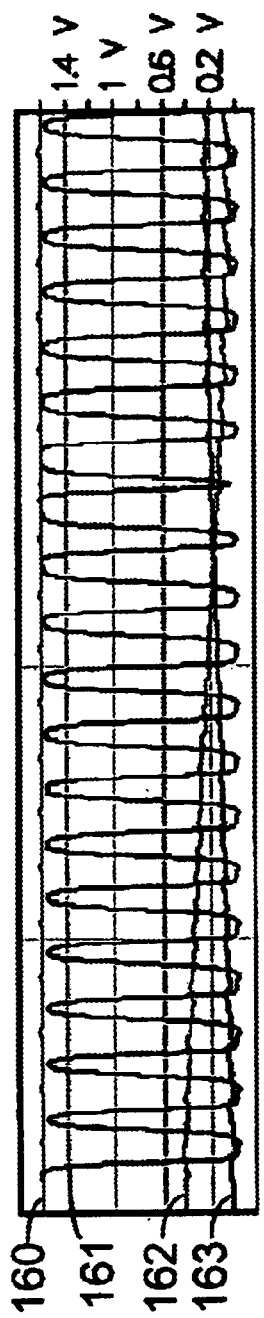
FIG. 7 illustrates relationships between a divided voltage signal associated with a data signal, a divided voltage signal associated with a data# signal, and differential outputs of a comparator coupled to the voltage signals according to some embodiments.

FIG. 7 illustrates differential outputs of a comparator according to some embodiments of comparators/decoder 150. As described with respect to FIG. 4, the FIG. 7 comparator is an element of a four-bit A/D converter having a configuration similar to A/D converter 2, but with each resistor string of the four-bit converter including sixteen resistors. The comparator compares a voltage $V_{111}$ at a node located between a tenth and an eleventh (counting from top) resistor of a resistor string coupled to transistor 133 with a voltage $V_{26}$ at a node located between a fifth and sixth resistor of a resistor string coupled to transistor 135. Waveforms 160 and 161 are the differential outputs of the comparator and waveforms 162 and 163 represent voltages $V_{111}$ and $V_{26}$ as voltage $V_{100}$ is swept from zero to 800 mV in 50 mV increments and as voltage $V_{110}$ is swept from 800 mV to zero in 50 mV increments. As described above, the illustrated comparator outputs may be used to generate a code representing a differential-mode signal based on a comparison of voltages $V_{111}$ and $V_{26}$.

Figure 8:
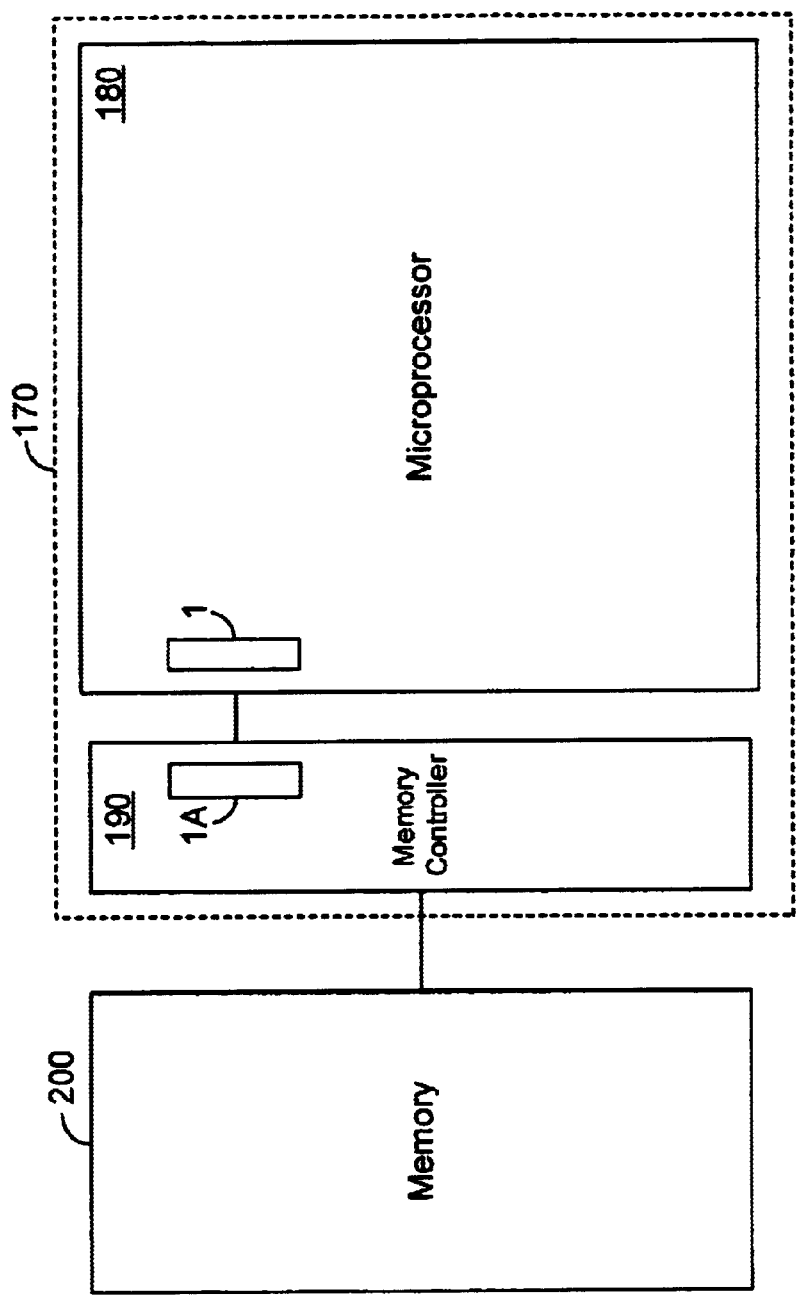
FIG. 8 is a block diagram of a system according to some embodiments.

FIG. 8 is a block diagram of a system according to some embodiments. Computer system 170 includes microprocessor 180, which includes an instance of A/D converter 1 of FIG. 1. Computer system 170 also includes memory controller/chipset 190 coupled to microprocessor 180. As shown, memory controller 190 also includes an instance of the A/D converter of FIG. 1, labeled as 1A. Memory controller 190 receives data stored in memory 200 and transmits the data to microprocessor 180, where the data may be received and converted by A/D converter 1. Similarly, microprocessor 180 may transmit the data to memory controller 190, where the data is converted from the analog domain to the digital domain by A/D converter 1A prior to transmission to memory 200.

Memory 200 may include any memory adapted to store data. Examples of such a memory include, but are not limited to, a hard drive, Dynamic Random Access Memory, Static Random Access Memory, Read-Only Memory, and Non-Volatile Random Access Memory. Moreover, microprocessor 180 may comprise any chip or processor including but not limited to a graphics processor, a digital signal processor, and a sound processor.

Thus, embodiments may substantially reduce power requirements, noise and/or processing time.

The several embodiments described herein are solely for the purpose of illustration. For example, although the above embodiments are described in conjunction with differential signaling, some embodiments may be used in conjunction with single-ended and/or pseudo-differential signaling. In some single-ended cases, one of signal lines A and B carries a signal received from a transmitting chip while the other signal line carries a reference voltage from the receiving chip based on which the received signal will be decoded. In some pseudo-differential cases, both of signal lines A and B carry signals received from a transmitting chip, with one of signal lines A and B carrying a signal to be decoded and the other signal line carrying a reference voltage upon which the decoding will be based. Accordingly, in each of the single-ended, pseudo-differential and differential cases, signal lines A and B may carry different ones of two signals that together represent a data signal.

Embodiments may include any currently or hereafter-known voltage dividers, samplers, comparators and/or voltage-to-current converters. Moreover, the ground-referenced PMOS transistors described herein may be substituted with $V_{cc}$-referenced n-channel metal oxide semiconductor transistors. Therefore, persons skilled in the art will recognize from this description that other embodiments may be practiced with various modifications and alterations.

What is claimed is:

1. A circuit, comprising:
a first voltage divider having a first end node and a second end node, the first end node to receive a first signal from a first signal line and the second end node to be coupled to ground, an impedance of the first voltage divider to match an impedance of the first signal line;
a second voltage divider having a third end node and a fourth end node, the third end node to receive a second signal from a second signal line and the fourth end node to be coupled to ground, an impedance of the second voltage divider to match an impedance of the second signal line, and the first signal and the second signal together representing a data signal; and
a comparator to compare a voltage generated by the first voltage divider with a voltage generated by the second voltage divider.

2. A circuit according to claim 1, further comprising:
a decoder to generate a code representing the data signal based on the comparison.

3. A circuit according to claim 1, further comprising:
a sampler to sample the voltage generated by the first voltage divider and to provide the sampled voltage to the comparator.

4. A circuit according to claim 1, further comprising:
a voltage-to-current converter to receive sampled voltages representing the data signal, to convert the voltages to currents, and to provide the currents to the two voltage dividers.

5. A circuit according to claim 4, further comprising:
a sampler to generate the sampled voltages.

6. A circuit according to claim 1, wherein the first voltage divider comprises a resistor string.

7. A circuit, comprising:
a first resistor string having a first end node and a second end node, the first end node to receive a first signal from a first signal line and the second end node to be coupled to ground, an impedance of the first resistor string to match an impedance of the first signal line;
a second resistor string having a third end node and a fourth end node, the third end node to receive a second signal from a second signal line and the fourth end node to be coupled to ground, an impedance of the second resistor string to match an impedance of the second signal line, and the first signal and the second signal together representing a data signal; and
a decoding circuit to generate a code representing the data signal based on a comparison of a first voltage generated by the first resistor string and a second voltage generated by the second resistor string.

8. A circuit according to claim 7, further comprising:
a comparison circuit to compare the first and the second voltage,
wherein the comparison circuit is adapted to compare a largest of voltages generated by the first resistor string with a smallest of voltages generated by the second resistor string and to compare a second-largest of voltages generated by the first resistor string with a second-smallest of voltages generated by the second resistor string.

9. A circuit according to claim 7, further comprising:
a voltage-to-current converter to receive a sampled voltage representing the first signal, to convert the sampled voltage to a current, and to provide the current to the first resistor string.

10. A circuit according to claim 9, further comprising:

a sampler to generate the sampled voltage.

11. A circuit comprising:

a first voltage divider having a first end node and a second end node, the first voltage divider to generate a first plurality of voltages based on a first signal received from a first signal line to be coupled to the first end node, the second end node to be coupled to ground, and an impedance of the first voltage divider to match an impedance of the first signal line;

a second voltage divider having a third end node and a fourth end node, the second voltage divider to generate a second plurality of voltages based on a second signal received from a second signal line to be coupled to the third end node, the fourth end node to be coupled to ground, and an impedance of the second voltage divider to match an impedance of the second signal line, and the first signal and the second signal together representing a data signal; and a decoding circuit to generate a code representing the data signal based on a comparison of a first voltage of the first plurality of voltages and a second voltage of the second plurality of voltages.

12. A circuit according to claim 11, further comprising:

a voltage-to-current converter to receive a sampled voltage representing the first signal, to convert the sampled voltage to a current, and to provide the current to the first voltage divider.

13. A circuit according to claim 11, further comprising:

a comparison circuit to compare the voltages, wherein the comparison circuit is adapted to compare a largest of the first plurality of voltages with a smallest of the second plurality of voltages and to compare a second-largest of the first plurality of voltages with a second-smallest of the second plurality of voltages.

14. A method comprising:

receiving a first signal from a first signal line coupled to a first end node of a first voltage divider, a second end node of the first voltage divider coupled to ground, and an impedance of the first voltage divider to match an impedance of the first signal line;

receiving a second signal from a second signal line coupled to a third end node of a second voltage divider, a fourth end node of the second voltage divider coupled to ground, an impedance of the second voltage divider to match an impedance of the second signal line, and the first signal and the second signal together representing a data signal;

generating a first plurality of voltages based on the first signal using the first voltage divider;

generating a second plurality of voltages based on the second signal using the second voltage divider;

comparing a first voltage of the first plurality of voltages and a second voltage of the second plurality of voltages; and generating a code representing the data signal based on the comparison.

15. A method according to claim 14, wherein the comparing step comprises:

comparing a largest of the first plurality of voltages with a smallest of the second plurality of voltages; and comparing a second-largest of the first plurality of voltages with a second-smallest of the second plurality of voltages.

16. A system comprising:

an analog to digital converter comprising:

a first voltage divider having a first end node and a second end node, the first voltage divider to generate a first plurality of voltages based on a first signal received from a first signal line to be coupled to the first end node, the second end node to be coupled to ground, and an impedance of the first voltage divider to match an impedance of the first signal line;

a second voltage divider having a third end node and a fourth end node, the second voltage divider to generate a second plurality of voltages based on a second signal received from a second signal line to be coupled to the third end node, the fourth end node to be coupled to ground, and an impedance of the second voltage divider to match an impedance of the second signal line, and the first signal and the second signal together representing a data signal; and a decoding circuit to generate a code representing the data signal based on a comparison of a first voltage of the first plurality of voltages and a second voltage of the second plurality of voltages; and a memory to store data represented by the data signal.

17. A system according to claim 16, wherein the analog to digital converter further comprises a comparison circuit to compare the voltages, and wherein the comparison circuit is adapted to compare a largest of the first plurality of voltages with a smallest of the second plurality of voltages and to compare a second-largest of the first plurality of voltages with a second-smallest of the second plurality of voltages.

* * * * *